United States Patent
Davis (10) Patent No.: US 7,473,584 B1
(45) Date of Patent: Jan. 6, 2009

(54) METHOD FOR FABRICATING A FAN-IN LEADFRAME SEMICONDUCTOR PACKAGE

(75) Inventor: Terry W. Davis, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 147 days.

(21) Appl. No.: 11/685,072

(22) Filed: Mar. 12, 2007

Related U.S. Application Data (62) Division of application No. 10/971,408, filed on Oct. 22, 2004, now Pat. No. 7,217,991.

(51) Int. Cl.
*H01L 21/00* (2006.01)

(52) U.S. Cl. .................. 438/123; 438/112; 438/124; 438/127; 257/E21.499; 257/E21.502; 257/E21.51

(58) Field of Classification Search ........... 257/E21.513
See application file for complete search history.

(56) References Cited

U.S. PATENT DOCUMENTS

| | | | |
|---|---|---|---|
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Walter L Lindsay, Jr.
*Assistant Examiner*—Cheung Lee
(74) *Attorney, Agent, or Firm*—Stetina Brunda Garred & Brucker (57) ABSTRACT

A semiconductor package comprising a plurality of elongate leads which each have opposed inner and outer ends, opposed first and second surfaces, and a third surface which is disposed in opposed relation to the first surface and recessed relative to the second surface. The second surface of each lead is positioned in close proximity to the inner end thereof. The third surface of each lead extends to the outer end thereof. A semiconductor die is attached to portions of the first surfaces of at least some of the leads. The semiconductor die is itself electrically connected to at least some of the leads. A package body covers the semiconductor die and the leads such that the second surfaces of the leads are exposed in a bottom surface of the package body and the outer ends of the leads are exposed in respective side surfaces of the package body.

20 Claims, 3 Drawing Sheets

U.S. PATENT DOCUMENTS

| | | |
|---|---|---|
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |

| | | |
|---|---|---|
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,667,546 B2 | 12/2003 | Huang et al. |
| 6,677,663 B1 | 1/2004 | Ku et al. |
| 6,700,189 B2 | 3/2004 | Shibata |
| 6,713,322 B2 * | 3/2004 | Lee ............................ 438/123 |
| 6,713,375 B2 | 3/2004 | Shenoy |
| 6,757,178 B2 | 6/2004 | Okabe et al. |
| 6,800,936 B2 | 10/2004 | Kosemura et al. |
| 6,867,492 B2 | 3/2005 | Auburger et al. |
| 7,005,327 B2 | 2/2006 | Kung et al. |
| 2001/0008305 A1 | 7/2001 | McClellan et al. |
| 2001/0014453 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2003/0198032 A1 | 10/2003 | Collander et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0164387 A1 | 8/2004 | Ikenaga et al. |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |

| | | |
|---|---|---|
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

METHOD FOR FABRICATING A FAN-IN LEADFRAME SEMICONDUCTOR PACKAGE

CROSS-REFERENCE TO RELATED APPLICATIONS

The present application is a divisional of U.S. patent application Ser. No. 10/971,408 entitled FAN-IN LEADFRAME PACKAGE filed Oct. 22, 2004 now U.S. Pat. No. 7,217,991.

STATEMENT RE: FEDERALLY SPONSORED RESEARCH/DEVELOPMENT

Not Applicable

BACKGROUND OF THE INVENTION

The present invention relates generally to integrated circuit chip package technology and, more particularly, to a unique fan-in leadframe design for a semiconductor package which provides a reduced land footprint thus improving solder joint reliability, and further simplifies motherboard routing due to the availability of free space under the semiconductor package outside of the land pattern.

Integrated circuit or semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, a semiconductor die, bonding material to attach the semiconductor die to the leadframe, bond wires which electrically connect pads or terminals on the semiconductor die to individual leads of the leadframe, and a hard plastic encapsulant material which covers the other components and forms the exterior of the package often referred to as the package body.

The leadframe is the central supporting structure of such a semiconductor package. A portion of the leadframe is internal to the package, i.e., completely surrounded by the plastic encapsulant. Portions of the leads of the leadframe extend externally from the package or are partially exposed within the encapsulant material for use in electrically connecting the package to another component.

In certain semiconductor package designs, the bottom surface of each of the leads of the leadframe is exposed within the bottom surface of the package body formed by the hardening of the encapsulant material. In this design, solderable surfaces are provided on only the bottom surface of the package body and, more particularly, by the exposed bottom surfaces of the leads which are often referred to as lands. This type of semiconductor package is typically attached to the printed circuit board or motherboard by printing solder paste on the board, positioning the exposed bottom surfaces of the leads upon the solder paste, and completing a hot reflow process.

One major drawback associated with the above-described semiconductor package design is the relatively large land footprint which results in certain situations, such as when a large semiconductor die is integrated into the package. This increased land footprint causes increased stress in the solder joints during temperature cycling and further complicates motherboard routing due to the increased amount of space needed to accommodate the semiconductor package. The present invention eliminates this deficiency by providing a semiconductor package having a fan-in leadframe and adapted to accommodate a large semiconductor die. The fan-in semiconductor package of the present invention provides a reduced land footprint, thereby improving solder joint reliability due to a reduction in stress on solder joints during temperature cycling. The reduced land footprint also allows for easier motherboard routing due to free space being available under the semiconductor package outside of the land pattern. These, as well as other features and advantages of the present invention, will be discussed in more detail below.

BRIEF SUMMARY OF THE INVENTION

In accordance with the present invention, there is provided a semiconductor package having a uniquely configured fan-in leadframe which is adapted to allow the semiconductor package to have a reduced land footprint or pattern despite accommodating a large semiconductor die. The reduced land footprint of the semiconductor package attributable to the inclusion of the fan-in leadframe improves solder joint reliability by reducing stress on solder joints during temperature cycling. The reduced land footprint also provides easier motherboard routing due to the free space available under the semiconductor package outside of the land pattern.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
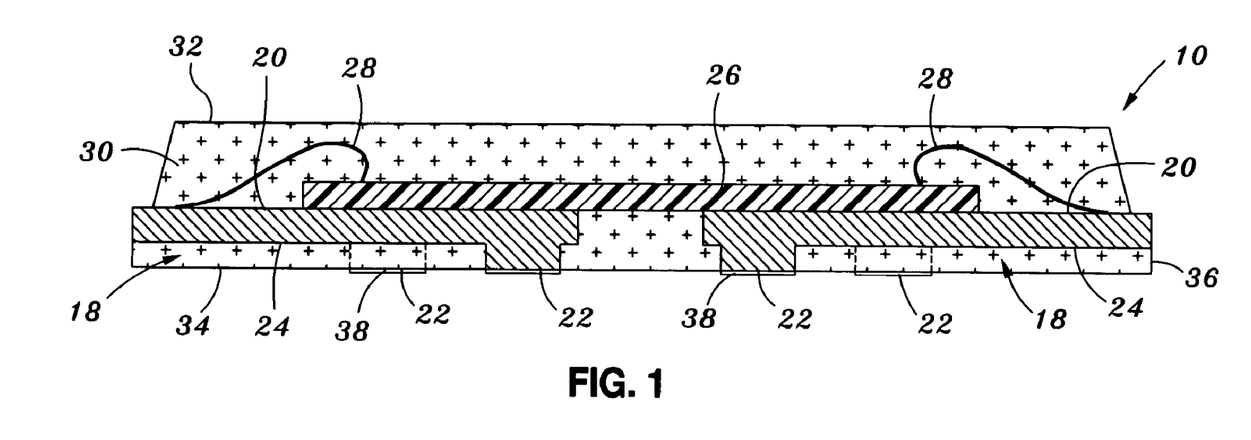
FIG. 1 is a cross-sectional view of a fan-in semiconductor package constructed in accordance with a first embodiment of the present invention.
Figure 2:
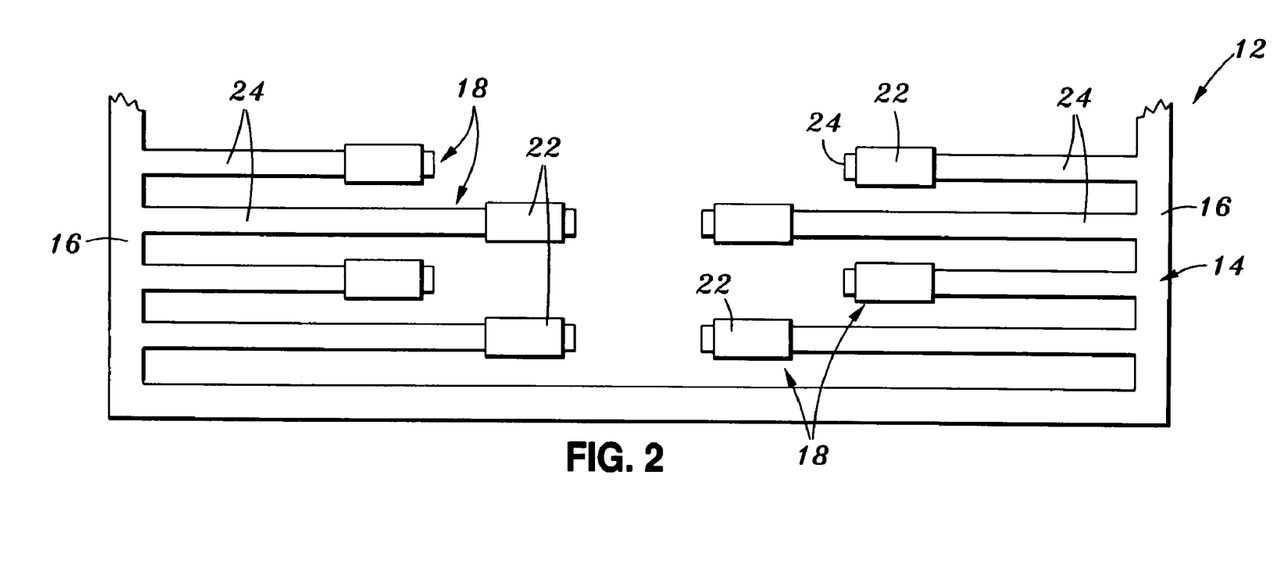
FIG. 2 is a partial bottom plan view of the fan-in leadframe integrated into the semiconductor package shown in FIG. 1.

Referring now to the drawings wherein the showings are for purposes of illustrating preferred embodiments of the present invention only, and not for purposes of limiting the same, FIG. 1 depicts a fan-in semiconductor package 10 constructed in accordance with a first embodiment of the present invention. The semiconductor package 10 comprises a fan-in leadframe 12, a partial bottom plan view of which is shown in FIG. 2. The leadframe 12 includes an outer frame 14 having a generally quadrangular (e.g., square, rectangular) configuration. In this regard, the outer frame 14 defines two pairs of opposed sides, with one such pair being labeled with the reference numerals 16 in FIG. 2. Due to the configuration of the outer frame 14, the pair of opposed sides 16 thereof extend in spaced, generally parallel relation to each other.

As further seen in FIG. 2, integrally connected to and extending inwardly from each of the opposed sides 16 of the outer frame 14 are a plurality of elongate leads 18. In this regard, the leads 18 are segregated into two sets, with the leads 18 of each such set being integrally connected to a respective one of the opposed sides 16. The leads 18 of each set are not of equal size, but rather are of at least two different lengths. Additionally, the leads 18 of each set are preferably arranged along a respective side 16 in a staggered pattern such that each adjacent pair of leads 18 of increased length has a lead 18 of decreased length therebetween as is shown in FIG. 2. The two sets of leads 18 are further arranged along the respective sides 16 of the outer frame 14 so that each lead 18 of increased length of one set extends in opposed relation to a lead 18 of increased length of the remaining set. Similarly, each lead 18 of reduced length of one set extends in opposed relation to a respective lead 18 of decreased length of the remaining set. As is further seen in FIG. 2, though the leads 18 of each set extend inwardly into the open interior of the outer frame 14, they are maintained in spaced relation to each other. In this regard, the opposed pairs of leads 18 of increased length are separated by identically sized gaps, with the opposed pairs of leads of decreased length also each being separated by identically sized gaps which are larger than those separating the opposed pairs of leads 18 of increased length.

As is shown in FIGS. 1 and 2, each of the leads 18 defines a generally planar first (top) surface 20 and an opposed, generally planar second (bottom) surface 22. In addition to the first and second surfaces 20, 22, each of the leads 18 defines a third surface 24 which is disposed in opposed relation to the first surface 20, but is perpendicularly offset or recessed relative to the second surface 22. As a result, as is best seen in FIG. 1, the thickness between the first and second surface 20, 22 of each lead 18 substantially exceeds the thickness between the first and third surfaces 20, 24 thereof. The leads 18 are also formed such that the area of increased thickness of each lead 18 (which defines the second surface 22 thereof) is disposed in close proximity to the distal end of such lead 18, the distal end being that end which is disposed furthest from the corresponding side 16 of the outer frame 14.

It is contemplated that the leadframe 12 will be fabricated from a conductive metal material (e.g., copper) through a mechanical stamping and/or chemical etching process. In this regard, the formation of the third surfaces 24 of the leads 18 preferably occurs as a result of the completion of a chemical etching process. As will be recognized, prior to any such chemical etching process, portions of each lead 18 are masked as needed to prevent any reduction in the original thickness thereof, such original thickness being reflected in the distance separating the first and second surfaces 20, 22 of each lead 18 from each other. As is further seen in FIG. 2, it is contemplated that each lead 18 may further be formed such that the width of the second surface 22 exceeds that of the third surface 24 thereof. However, those of ordinary skill in the art will recognize that the second and third surfaces 22, 24 of each lead 18 need not necessarily be formed to be of differing widths.

In addition to the leadframe 12, the semiconductor package 10 comprises a semiconductor die 26. As seen in FIG. 1, the semiconductor die 26 is attached to portions of the first surfaces 20 of at least some of the leads 18 of each of the first and second sets thereof. The attachment of the semiconductor die 26 to the first surfaces 20 of the leads 18 is preferably facilitated through the use of a suitable adhesive. Upon the mounting of the semiconductor die 26 to the leads 18 in the above-described manner, conductive wires 28 are used to electrically connect pads or terminals disposed on the top surface of the semiconductor die 26 to the first surfaces 20 of respective ones of the leads 18. Though not shown, it is contemplated that at least a portion of the first surface 20 of each of the leads 18 may include a layer of conductive plating formed thereon to assist in the adhesion and conductive connection of the conductive wire 28 to the corresponding lead 18.

Subsequent to the electrical connection of the semiconductor die 26 to the leads 18 through the use of the conductive wires 28, a plastic encapsulant material is applied to portions of the leadframe 12, the semiconductor die 26, and the conductive wires 28. The hardening of the encapsulant material facilitates the formation of a package body 30 of the semiconductor package 10. The package body 30 defines a generally planar top surface 32, an opposed, generally planar bottom surface 34, and a peripheral side surface 36 which extends generally perpendicularly relative to the bottom surface 34. In the semiconductor package 10, the second surfaces 22 of the leads 18 are exposed in and substantially flush with the bottom surface 34 of the package body 30. These exposed second surfaces 22 of the leads 18 define the "lands" and hence the land pattern or footprint of the semiconductor package 10. It is contemplated that each land defined by the second surface 22 of a respective lead 18 may include a layer of solderable plating 38 (e.g., NiPd, Matte Sn) applied thereto. Such layers of solderable plating 38 will typically be applied to the second surfaces 32 of the leads 18 subsequent to the complete formation of the package body 30.

It will be recognized that the complete formation of the semiconductor package 10 involves the singulation or severing of the outer frame 14 of the leadframe 12 from the remainder thereof. Such singulation occurs subsequent to the formation of the package body 30, and may be completed via a sawing or punching process. The singulation or removal of the outer frame 14 from the remainder of the leadframe 12 effectively electrically isolates the individual leads 18 from each other. As a result of the completion of the singulation process, each lead 18 defines an outer end which is exposed in and substantially flush with the side surface 36 of the package body 30, the third surface 24 extending to such outer end. Advantageously, the partial etching of the leads 18 as facilitates the formation of the third surfaces 24 thereof allows the encapsulant material which is used to form the package body 30 to underflow the leads 18 in a manner covering the third surfaces 24 thereof, thereby effectively locking the leads 18 to the package body 30.

Due to the configuration of each of the leads 18 of the semiconductor package 10 as described above, the land footprint of the semiconductor package 10 is significantly reduced in comparison to the land footprint which would result if the second surfaces 22 of the leads 18 were all located at or in very close proximity to the peripheral side surface 36 of the package body 30 in accordance with conventional semiconductor package designs. Signals transmitted from the semiconductor die 26 to the leads 18 via the conductive wires 28 are routed inwardly to the second surfaces 22 of the leads 18, and hence the lands defined thereby. As indicated above, the fan-in configuration of the leadframe 12 and hence the semiconductor package 10 results in improvements in solder joint reliability due to the reduced land footprint, and further allows for easier motherboard routing due to the free space available under the semiconductor package 10 outside of the land pattern defined by the second surfaces 22 of the leads 18.

Figure 3:
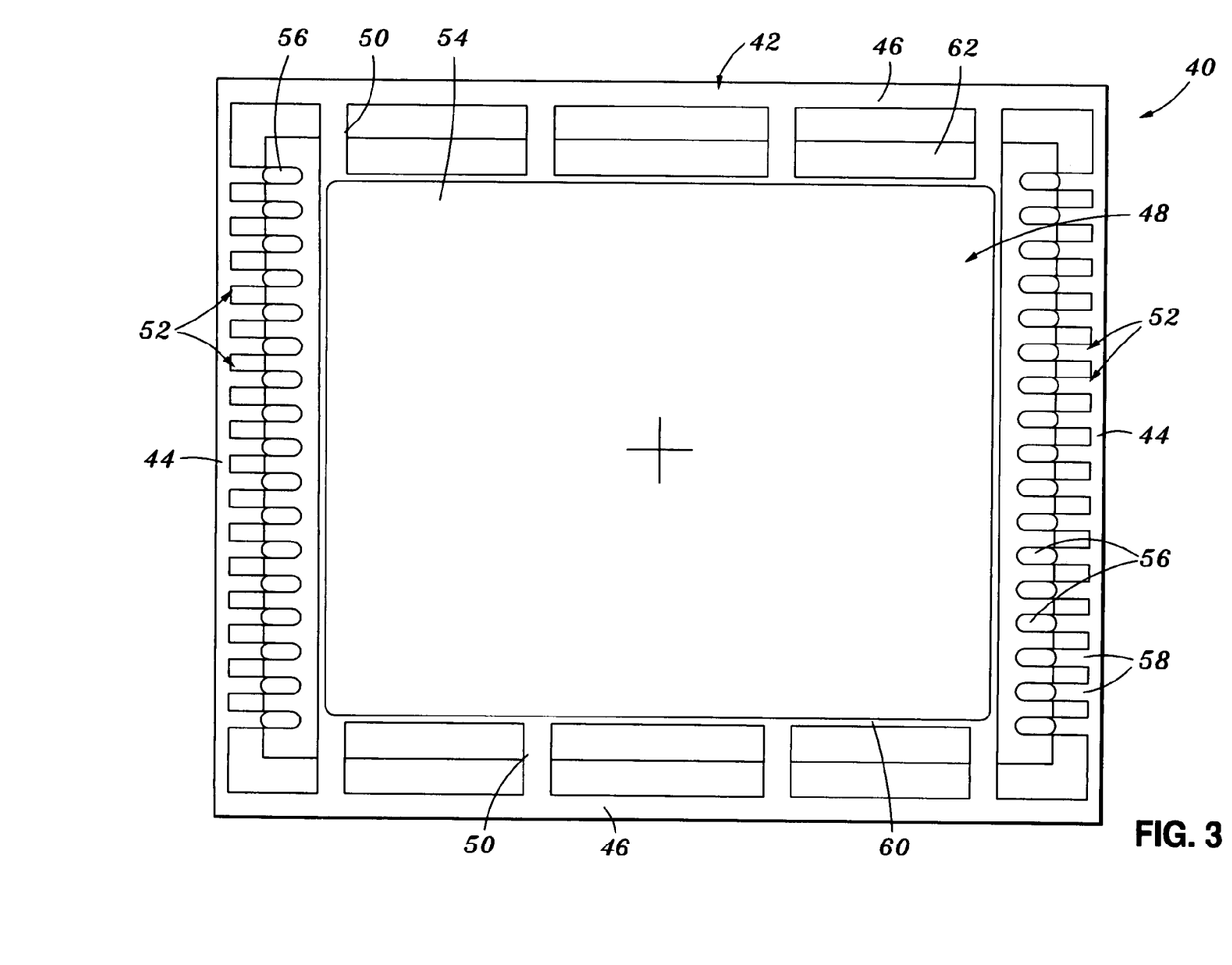
FIG. 3 is a bottom plan view of a fan-in leadframe constructed in accordance with a second embodiment of the present invention and having a semiconductor die mounted thereto.

Referring now to FIG. 3, there is shown a fan-in leadframe 40 constructed in accordance with a second embodiment of the present invention. The leadframe 40 includes an outer frame 42 having a generally quadrangular (e.g., square, rectangular) configuration. The outer frame 14 defines two pairs of opposed sides, with one such pair being labeled with the reference numerals 44 in FIG. 3, and the remaining pair being labeled with the reference numerals 46.

The leadframe 40 includes a generally quadrangular die pad 48 which resides within the interior of the outer frame 46. The die pad 48 is integrally connected to the sides 46 of the outer frame 42 by a plurality of tie bars 50 extending therebetween. Integrally connected to and extending inwardly from each of the opposed sides 44 of the outer frame 42 are a plurality of elongate leads 52. The leads 52 are segregated into two sets, with the leads 52 of each such set being integrally connected to a respective one of the opposed sides 44. The leads 52 of each set are of equal length. Though not required, the leads 52 are preferably arranged to extend inwardly into the open interior of the outer frame 42 such that each lead 52 of one set extends in opposed relation to a respective one of the leads 52 of the remaining set.

In the leadframe 40, the die pad 48 defines a generally planar first (top) surface and an opposed, generally planar second (bottom) surface 54. The die pad 48 is not formed to be of uniform thickness. Rather, the die pad 48 defines a third surface 60 which circumvents the second surface 54, and is perpendicularly offset or recessed relative to the second surface 54. As a result, the thickness between the first surface and the second surface 54 of the die pad 48 substantially exceeds the thickness between the first surface and the third surface 60 thereof.

Similarly, each of the leads 52 defines a generally planar first (top) surface and an opposed, generally planar second (bottom) surface 56. In addition to the first surface and second surface 56, each of the leads 52 defines a third surface 58 which is disposed in opposed relation to the first surface thereof, but is perpendicularly offset or recessed relative to the second surface 56. As a result, the thickness between the first surface and second surface 56 of each lead 52 substantially exceeds the thickness between the first surface and the third surface 58 thereof. The leads 52 are also formed such that the area of increased thickness of each lead 52 (which defines the second surface 56 thereof) extends to the distal end of such lead 52, the distal end being that end which is disposed furthest from the corresponding side 44 of the outer frame 42.

It is contemplated that the leadframe 40 will be fabricated from a conductive metal material (e.g., copper) through a mechanical stamping and/or chemical etching process. In this regard, the formation of the third surfaces 58 of the leads 52 and third surface 60 of the die pad 48 preferably occur as a result of the completion of a chemical etching process. As will be recognized, prior to any such chemical etching process, portions of each lead 52 and the die pad 48 are masked as needed to prevent any reduction in the original thickness thereof, such original thicknesses being reflected in the distance separating the first surface and second surface 56 of each lead 52 from each other, and the distance separating the first surface and the second surface 54 of the die pad 48 from each other. In the leadframe 40, the tie bars 50 used to secure the die pad 48 to the outer frame 42 are also subjected to the chemical etching process in a manner effectively decreasing the thickness thereof. In the fully etched leadframe 40, the second surfaces 56 of the leads 52 extend in generally coplanar relation to the second surface 54 of the die pad 48.

In FIG. 3, a semiconductor die 62 is shown as being mounted to the first surface of the die pad 48 and to portions of the first surfaces of at least some of the leads 52 of each of the first and second sets thereof. The attachment of the semiconductor die 62 to the die pad 48 and to the leads 52 is preferably facilitated through the use of a suitable adhesive. Upon the mounting of the semiconductor die 62 to the die pad 48 and leads 52 in the above-described manner, conductive wires are used to electrically connect pads or terminals disposed on the semiconductor die 62 to the first surfaces of respective ones of the leads 52. At least a portion of the first surface of each of the leads 52 may include a layer of conductive plating formed thereon to assist in the adhesion and conductive connection of these conductive wires to the corresponding leads 52.

Though not shown in FIG. 3, subsequent to the electrical connection of the semiconductor die 62 to the leads 52 through the use of the conductive wires, a plastic encapsulant material is applied to portions of the leadframe 40, the semiconductor die 62 and such conductive wires. As described above in relation to the semiconductor package 10, the hardening of such encapsulant material facilitates the formation of a package body. In the fully formed package body, the second surfaces 56 of the leads 52 will be exposed in and substantially flush with a bottom surface defined by such package body. Also exposed in and substantially flush with the bottom surface of such package body will be the bottom surface 54 of the die pad 48. The exposed second surfaces 56 of the leads 52 will define the lands and hence the land pattern or footprint of the semiconductor package including the leadframe 40.

It will be recognized that the complete formation of a semiconductor package including the leadframe 40 will involve the singulation or severing of the outer frame 42 of the leadframe 40 from the remainder thereof. The singulation or removal of the outer frame 42 from the remainder of the leadframe 40 effectively electrically isolates the leads 52 from each other. In the fully formed semiconductor package, the outer ends of the leads 52 formed as a result of the singulation or removal of the outer frame 42 will be exposed in and substantially flush with the side surface of the package body, the third surface 53 of each lead 52 extending to the outer end thereof. Similarly, the singulation process will result in the tie bars 50 of the leadframe 40 defining outer ends which are exposed in and substantially flush with the side surface of the package body. Advantageously, the partial etching of the leads 52 as facilitates the formation of the third surfaces 58 thereof allows the encapsulant material which is used to form the package body to underflow the leads 52 in a manner covering the third surfaces 58 thereof, thereby effectively locking the leads 52 to the package body. Similarly, the encapsulant material is able to underflow the peripheral portion of the die pad 48 in a manner covering the third surface 60, thereby further locking the die pad 48 to the package body. The configuration of the leads 52 in a semiconductor package constructed through the use of the leadframe 40 provides the same advantages described above in relation to the leads 18 of the semiconductor package 10.

It is contemplated that certain variations may be made to the leadframes 12, 40 without departing from the spirit and scope of the present invention. For example, the leads 18 of the leadframe 12 may alternatively be provided in equal lengths, with the leads 52 of the leadframe 40 alternatively being provided in differing lengths. Additionally, in the leadframe 12, it is contemplated that leads 18 of identical or differing lengths may be integrally connected to and extended inwardly from all four sides of the outer frame 14, rather than only the opposed sides 16 thereof. Similarly, in the leadframe 40, the leads 52 may be integrally connected to and extend inwardly from all of the sides 44, 46 of the outer frame 42, rather than from only the sides 44 thereof. In such alternative configuration, the die pad 48 may be supported within the interior of the outer frame 42 by tie bars which extend from respective corners of the die pad 48 to corresponding corners of the outer frame 42.

Figure 4:
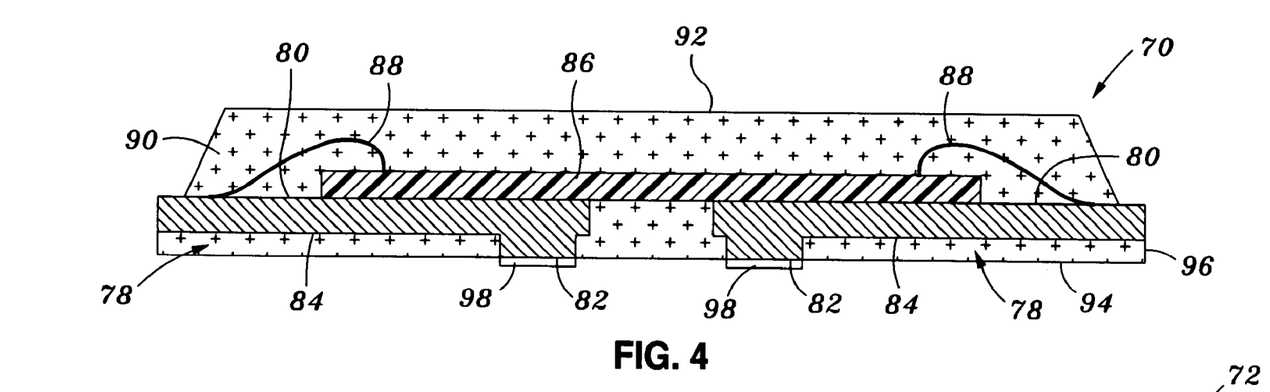
FIG. 4 is a cross-sectional view of a fan-in semiconductor package constructed in accordance with a third embodiment of the present invention.
Figure 5:
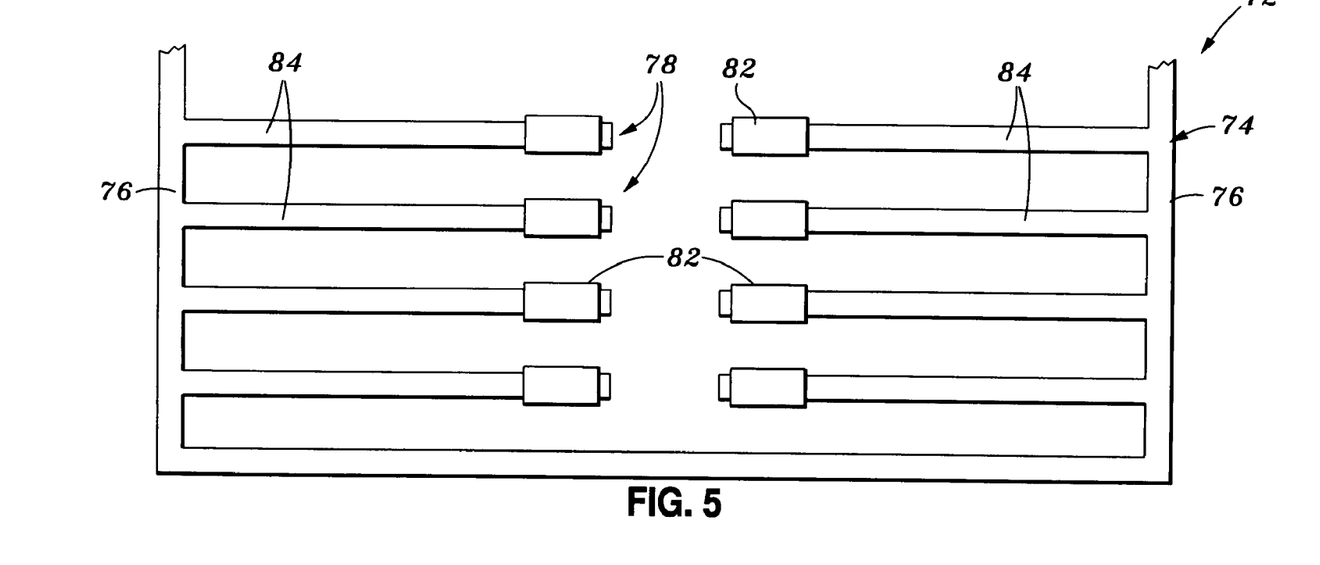
FIG. 5 is a partial bottom plan view of the fan-in leadframe integrated into semiconductor package shown in FIG. 4.

Referring now to FIG. 4, there is shown a fan-in semiconductor package 70 constructed in accordance with a third embodiment of the present invention. The semiconductor package 70 comprises a fan-in leadframe 72, a partial bottom plan view of which is shown in FIG. 5. The leadframe 72 includes an outer frame 74 having a generally quadrangular (e.g., square, rectangular) configuration. In this regard, the outer frame 74 defines two pairs of opposed sides, with one such pair being labeled with the reference numerals 76 in FIG. 5. Due to the configuration of the outer frame 74, the pair of opposed sides 76 thereof extend in spaced, generally parallel relation to each other.

Integrally connected to and extending inwardly from each of the opposed side 76 of the outer frame 74 are a plurality of elongate leads 78. The leads 78 are segregated into two sets, with the leads 78 of each such set being integrally connected to a respective one of the opposed sides 76. The leads 78 of each set are preferably of substantially equal length. The two sets of leads 78 are arranged along respective sides 76 of the outer frame 74 so that each lead 78 of one set extends in opposed relation to a lead 78 of the remaining set. The opposed pairs of the leads 78 are separated from each other by identically sized gaps.

As shown in FIGS. 4 and 5, each of the leads 78 defines a generally planar first (top) surface 80 and an opposed, generally planar second (bottom) surface 82. In addition to the first and second surfaces 80, 82, each of the leads 78 defines a third surface 84 which is disposed in opposed relation to the first surface 80, but is perpendicularly offset or recessed relative to the second surface 82. As a result, as is best seen in FIG. 4, the thickness between the first and second surfaces 80, 82 of each lead 78 substantially exceeds the thickness between the first and third surfaces 80, 84 thereof. The leads 78 are also formed such that the area of increased thickness of each lead 78 (which defines the second surface 82 thereof) is disposed in close proximity to the distal end of such lead 78, the distal end being that end which is disposed furthest from the corresponding side 76 of the outer frame 74.

Like the leadframe 12 described above, it is contemplated that the leadframe 72 will be fabricated from a conductive metal material (e.g., copper) through a mechanical stamping and/or chemical etching process. The formation of the third surfaces 84 of the leads 78 preferably occurs as a result of the completion of a chemical etching process. Prior to any such chemical etching process, portions of each lead 78 are masked as needed to prevent any reduction in the original thickness thereof, such original thickness being reflected in the distance separating the first and second surfaces 80, 82 of each lead 78 from each other. As further seen in FIG. 5, it is contemplated that each lead 78 may further be formed such that the width of the second surface 82 exceeds that of the third surface 84 thereof. However, those of ordinary skill in the art will recognize that the second and third surfaces 82, 84 of each lead 78 need not necessarily be formed to be of differing widths.

In addition to the leadframe 72, the semiconductor package 70 comprises a semiconductor die 86. As seen in FIG. 4, the semiconductor die 86 is attached to portions of the first surfaces 80 of at least some of the leads 78 of each of the first and second sets thereof. The attachment of the semiconductor die 86 to the first surfaces 80 of the leads 78 is preferably facilitated through the use of a suitable adhesive. Upon the mounting of the semiconductor die 86 to the leads 78 in the above-described manner, conductive wires 88 are used to electrically connect pads or terminals disposed on the top surface of the semiconductor die 86 to the first surfaces 80 of respective ones of the leads 78. Though not shown, it is contemplated that at least a portion of the first surface 80 of each of the leads 78 may include a layer of conductive plating formed thereon to assist in the adhesion and conductive connection of each conductive wire 88 to the corresponding lead 78.

Subsequent to the electrical connection of the semiconductor die 86 to the leads 78 through the use of the conductive wires 88, a plastic encapsulant material is applied to portions of the leadframe 72, the semiconductor die 86, and the conductive wires 88. The hardening of the encapsulant material facilitates the formation of a package body 90 of the semiconductor package 70. The package body 90 defines a generally planar top surface 92, an opposed, generally planar bottom surface 94, and a peripheral side surface 96 which extends generally perpendicularly relative to the bottom surface 94. In the semiconductor package 70, the second surfaces 82 of the leads 78 are exposed in and substantially flush with the bottom surface 94 of the package body 90. These exposed second surfaces 82 of the leads 78 define the "lands" and hence the land pattern or footprint of the semiconductor package 70. It is contemplated that each land defined by the second surface 82 of a respective lead 78 may include a layer of solder plating 98 applied thereto. Such layers of solder plating 98 will typically be applied to the second surfaces 82 of the leads 78 subsequent to the complete formation of the package body 90.

The complete formation of the semiconductor package 70 involves the singulation or severing of the outer frame 74 of the leadframe 72 from the remainder thereof. Such singulation occurs subsequent to the formation of the package body 90, and may be completed via a sawing or punching process. The singulation or removal of the outer frame 74 from the remainder of the leadframe 72 effectively electrically isolates the individual leads 78 from each other. As a result of the completion of the singulation process, each lead 78 defines an outer end which is exposed in and substantially flush with the side surface 96 of the package body 90, the third surface 84 extending to such outer end. The partial etching of the leads 78 as facilitates the formation of the third surfaces 84 thereof allows the encapsulant material which is used to form the package body 90 to underflow the leads 78 in a manner covering the third surfaces 84, thereby effectively locking the leads 78 to the package body 90.

Due to the configuration of each of the leads 78 of the semiconductor package 70, the land footprint of the semiconductor package 70 is significantly reduced in comparison to the land footprint which would result if the second surfaces 82 of the leads 78 were all located at or in very close proximity to the peripheral side surface 96 of the package body 90 in accordance with conventional semiconductor package designs. Signals transmitted from the semiconductor die 86 to the leads 78 via the conductive wires 88 are routed inwardly to the second surfaces 82 of the leads 78, and hence the lands defined thereby. The fan-in configuration of the leadframe 72 and hence the semiconductor package 70 results in improvements in solder joint reliability due to the reduced land footprint, and further allows for easier motherboard routing due to the free space available under the semiconductor package 70 outside of the land pattern defined by the second surfaces 82 of the leads 78.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a semiconductor package, comprising the steps of:
   a) providing a leadframe having an outer frame and a plurality of elongate leads attached to the outer frame, each of the leads having:
      an inner end;
      a first surface;
      a second surface disposed in opposed relation to the first surface and positioned in close proximity to the inner end; and
      a third surface disposed in opposed relation to the first surface and recessed relative to the second surface, the third surface extending to the outer frame;
   b) attaching a semiconductor die attached to portions of the first surfaces of at least some of the leads;
   c) electrically connecting the semiconductor die to at least some of the leads; and
   d) covering the semiconductor die and the leads with a package body such that the second surfaces of the leads are exposed in a bottom surface of the package body and the outer ends of the leads are exposed in a side surface of the package body.

2. The method of claim 1 wherein step (a) comprises providing a leadframe wherein the leads are segregated into two sets which are integrally connected to and extend along respective ones of an opposed pair of sides of the outer frame.

3. The method of claim 2 wherein step (a) comprises providing a leadframe wherein the leads of each set are provided in at least two differing lengths.

4. A method of fabricating a semiconductor package, comprising the steps of:
   a) providing a leadframe having an outer frame and a plurality of elongate leads which are attached to the outer frame, each of the leads having:
      an inner end;
      a first surface;
      a second surface disposed in opposed relation to the first surface and positioned in close proximity to the inner end; and
      a third surface disposed in opposed relation to the first surface and recessed relative to the second surface, the third surface extending to the outer frame;
      the leads being segregated into at least two sets, with the leads of each set being provided in only first and second differing lengths;
   b) attaching a semiconductor die to portions of the first surfaces of each of the leads;
   c) electrically connecting the semiconductor die to at least some of the leads; and
   d) covering the semiconductor die and the leads with a package body such that the second surfaces of the leads are exposed in a bottom surface of the package body.

5. The method of claim 4 wherein step (c) comprises electrically connecting the semiconductor die to the first surfaces of at least some of the leads via conductive wires, and step (d) comprises covering the conductive wires with the package body.

6. The method of claim 4 wherein step (a) comprises providing a leadframe wherein the leads are segregated into only two sets which are oriented so as to extend along respective ones of an opposed pair of sides of the semiconductor die attached to the leads in step (b).

7. The method of claim 4 wherein step (a) comprises providing a leadframe wherein the leads of each set are arranged in a staggered pattern such that each lead of the first length is disposed between an adjacent pair of leads of the second length.

8. The method of claim 7 wherein step (a) comprises providing a leadframe wherein the second lead surfaces of the leads of the first length are offset relative to the second lead surfaces of the leads of the first length.

9. The method of claim 8 wherein step (a) comprises providing a leadframe wherein the leads are segregated into only two sets which are oriented so as to extend along respective ones of an opposed pair of sides of the semiconductor die attached to the leads in step (b).

10. The method of claim 4 wherein step (b) comprises attaching the semiconductor die to the leads such that the semiconductor die overlies the entirety of the second surface of each of the leads.

11. The method of claim 4 wherein step (a) comprises providing a leadframe further comprising a die pad defining opposed first and second surfaces, and step (b) comprises attaching the semiconductor die to at least a portion of the first surface of the die pad.

12. The method of claim 11 wherein step (a) comprises providing a leadframe wherein the second surface of the die pad and the second surfaces of the leads extend in generally co-planar relation to each other.

13. The method of claim 11 wherein step (a) comprises providing a leadframe wherein the die pad further comprises a third surface which circumvents the second surface thereof and is recessed relative thereto, and step (d) comprises covering the third surface of the die pad with the package body.

14. The method of claim 4 wherein step (a) comprises providing a leadframe wherein the second surface of each of the leads extends to the inner end thereof.

15. A method of fabricating a semiconductor package, comprising the steps of:
   a) providing a leadframe having an outer frame and a plurality of elongate leads which are attached to the outer frame, each of the leads having:
      an inner end;
      a first surface;
      a second surface disposed in opposed relation to the first surface and positioned in close proximity to the inner end; and
      a third surface disposed in opposed relation to the first surface and recessed relative to the second surface, the third surface extending to the outer frame;
      the leads being segregated into at least two sets, with the second surfaces of the leads of each set being arranged in a staggered pattern;
   b) attaching a semiconductor die to portions of the first surfaces of at least some of the leads such that the semiconductor die overlies the entirety of the second surface of each of the leads
   c) electrically connecting the semiconductor die to at least some of the leads; and
   (d) covering the semiconductor die and the leads with a package body such that the second surfaces of the leads are exposed in and substantially flush with a bottom surface of the package body.

16. The method of claim 15 wherein step (c) comprises electrically connecting the semiconductor die to portions of the first surfaces of at least some of the leads which are disposed in opposed relation to the third surfaces thereof via conductive wires, and step (d) comprises covering the conductive wires with the package body.

17. The method of claim 15 wherein step (a) comprises providing a leadframe wherein the leads of each set are provided in only first and second differing lengths and arranged such that each lead of the first length is disposed between an adjacent pair of leads of the second length.

18. The method of claim 15 wherein step (a) comprises providing a leadframe wherein the leads are segregated into only two sets which are oriented so as to extend along respective ones of an opposed pair of sides of the semiconductor die attached to at least some of the leads in step (b).

19. The method of claim 18 wherein step (a) comprises providing a leadframe wherein the leads of each set are provided in only first and second differing lengths and arranged such that each lead of the first length is disposed between an adjacent pair of leads of the second length.

20. The method of claim 15 further comprising the step of:
(e) severing the outer frame from the leads such that each of the leads defines an outer end which is disposed in opposed relation to the inner end thereof and exposed in a side surface of the package body.

\* \* \* \* \*